United States Patent [19]
Mizukami

[11] Patent Number: 5,581,103
[45] Date of Patent: Dec. 3, 1996

[54] SEMICONDUCTOR INTEGRATED CIRCUIT DEVICE WITH INPUT-PROTECTING CIRCUIT

[75] Inventor: Shigeto Mizukami, Kawasaki, Japan

[73] Assignee: Kabushiki Kaisha Toshiba, Tokyo, Japan

[21] Appl. No.: 271,146

[22] Filed: Jul. 6, 1994

[30] Foreign Application Priority Data

Jul. 7, 1993 [JP] Japan .................. 5-168053

[51] Int. Cl.$^6$ .................. H01L 29/78
[52] U.S. Cl. .................. 257/355; 257/356; 257/357; 257/360; 257/368; 257/369; 257/370
[58] Field of Search .................. 257/355, 356, 257/357, 368, 369, 370, 360

[56] References Cited

U.S. PATENT DOCUMENTS 5,148,255  9/1992  Nakazato et al. .................. 257/369
5,181,091  1/1993  Harrington, III et al. .................. 257/355

OTHER PUBLICATIONS

Tampa, Nobuo, et al., "Session XIII: Static RAMs", Digest of Technical Papers, IEEE International Solid–State Circuits Conference, Feb. 18, 1988.

*Primary Examiner*—Jerome Jackson
*Assistant Examiner*—Valencia Martin Wallace
*Attorney, Agent, or Firm*—Loeb & Loeb LLP

[57] ABSTRACT

A semiconductor integrated circuit device, comprises: an $n^+$-type buried layer 12 formed on a surface of a p-type semiconductor substrate 11; an n-type semiconductor layer 71 formed on the $n^+$-type buried layer 12; a first p type well 16 formed in the semiconductor layer 71; a second p-type well 18 formed in the semiconductor layer 71 and electrically isolated from the first p-type well 16; an input-protecting N-type MOS transistor 102 formed in the first p-type well 16 and having a drain 22 grounded, a source 25 connected to an input terminal 101 to which an external signal is input, and a gate 23 grounded; and an $n^+$-type impurity region 27 grounded and formed in the second p-type well 18. Whenever a negative surge voltage is applied to the input terminal 101, a current path is formed from the ground $V_{SS}$ to the input terminal 101, by way of the impurity region 27 formed in the second p-type well 18, the $n^+$-type buried layer 12, and the source 25 formed in the first p-type well 16, in addition to the current path through the input-protecting N-type MOS transistor 102 formed in the first p-type well 16, thus improving the input-protection characteristics of the circuits formed in the same semiconductor substrate against a surge voltage applied to the input terminal 101.

12 Claims, 4 Drawing Sheets

5,581,103

SEMICONDUCTOR INTEGRATED CIRCUIT DEVICE WITH INPUT-PROTECTING CIRCUIT

BACKGROUND OF THE INVENTION

The present invention relates to a semiconductor integrated circuit device, and more specifically to a semiconductor integrated circuit device provided with an input-protecting circuit.

FIG. 4 is a circuit diagram showing both an input-protecting circuit related to the present invention and a first stage of an internal circuit. In FIG. 4, an input terminal 101 for inputting an external signal is connected to an inverter INV11 at a node N11. The inverter INV11 is a first stage of an internal circuit and composed of a P-channel transistor 103 and an N-channel transistor 104. Further, an N-channel transistor 102 is connected to the node N11 as an input protecting circuit. In more detail, the source of this N-channel transistor 102 is connected to the node N11, and the gate and drain thereof are both grounded. Further, a substrate bias voltage is supplied from a substrate bias circuit (not shown) to a substrate terminal of the N-channel transistors 102 and 104. Further, although not shown, a succeeding stage (not shown) of the internal circuit is connected to an output terminal 105 of the inverter INV11.

FIG. 5 shows a longitudinal cross-sectional view of a semiconductor substrate on which the above-mentioned input-protecting N-channel transistor 102 and the inverter INV11 are both formed.

A p-type semiconductor substrate 111 is formed with a source region ($n^+$-type impurity region) 114, a drain region ($n^+$-type impurity region) 113, a gate oxide film 125, and a gate electrode 126, so as to construct the N-channel transistor 102.

Further, the p-type semiconductor substrate 111 is formed with a source region ($n^+$-type impurity region) 115, a drain region ($n^+$-type impurity region) 116, a gate oxide film 127, and a gate electrode 128, so as to construct the N-channel transistor 104 of the inverter INV11. Further, the substrate 111 is formed, in an n type well 117, with a source region ($p^+$-type impurity region) 121, a drain region ($p^+$-type impurity region) 118, a gate oxide film 119, and a gate electrode 120, so as to construct the P-channel transistor 103 of the inverter INV11. In this n-type well 117, an $n^+$-impurity region 122 is further formed so as to be connected to a supply voltage (Vcc) terminal $V_{CC}$. Further, the two drain regions 116 and 118 are connected to an output terminal 105.

In the circuit as described above, when a negative surge voltage is applied to the input terminal 101, in the input-protecting N-channel transistor 102, current flows from the ground terminal $V_{SS}$ to the input terminal 101 only when a potential difference between the source region 114, connected to the input terminal 101, and the drain region 113 and the gate electrode 126, both connected to the ground terminal $V_{SS}$, exceeds a threshold voltage of the N-channel transistor 102. Therefore, it is possible to prevent a negative surge voltage from being applied to the inverter INV11, that is, the first input stage of the internal circuit, with the result that the internal circuit can be protected from the surge voltage applied to the input terminal.

Here, the dielectric strength of the gate oxide films 119 and 127 of the inverter INV11 against the negative surge voltage is determined on the basis of the current characteristics of the N-channel transistor 102 which serves as an input-protecting circuit. Accordingly, when the current-driving capability of the N-channel transistor 102 is increased, it is possible to improve the input-protection characteristics. In this case, however, when the width W of the N-channel transistor 102 is increased to obtain a high current-driving capability, since it is necessary to suppress an increase of the input capacitance, there exists inevitably a restriction in an increase of the width W. On the other hand, when the length L of the N-channel transistor 102 is shortened, the dielectric breakdown of the input-protecting N-channel transistor 102 itself deteriorates, with the result that it is impossible to increase the breakdown voltage of the input-protecting transistor 102 against a surge voltage.

For the reasons as above, in the input-protecting circuit as shown in FIG. 5, it has been so far difficult to improve the input-protecting characteristics sufficiently.

SUMMARY OF THE INVENTION

Accordingly, it is the object of the present invention to provide a semiconductor integrated circuit provided with an input-protecting circuit having a high protection characteristic.

To achieve the above-mentioned object, the present invention provides a semiconductor integrated circuit device, comprising: a reverse conductive type buried layer formed on a surface of a certain conductive type semiconductor substrate; a reverse conductive type semiconductor layer formed on said buried layer; a certain conductive type first well formed in said semiconductor layer; a certain conductive type second well formed in said semiconductor layer and electrically isolated from said first well; a reverse conductive type MOS transistor formed in said first well and having one end grounded, the other end connected to an input terminal to which an external signal is input, and a gate connected to said ground end; a reverse conductive type impurity region grounded and formed in said second well; and when a surge voltage is applied to the input terminal, a current path is formed by way of said impurity region formed in said second well, said buried layer, and the other end formed in said first well, and the input terminal.

In the semiconductor integrated circuit device according to the present invention, when a surge voltage is applied to the input terminal, a since current path can be formed not only through the input-protecting MOS transistor but also by way of the impurity region formed in the second well, the buried layer, the other end formed in the first well, and input terminal, it is possible to improve the protective characteristics of the circuit device against the surge voltage.

Further, the present invention provides a semiconductor integrated circuit device, comprising: a reverse conductive type buried layer formed on a surface of a certain conductive type semiconductor substrate in accordance with an impurity diffusion method; a reverse conductive type epitaxial layer formed on said buried layer in accordance with a vapor phase epitaxy method; certain conductive type first and second wells formed in said epitaxial layer being spaced away from each other under electrically isolated conditions; a certain conductive type impurity region formed in said first well, to which a substrate bias voltage is applied; a reverse conductive type MOS transistor formed in said first well and having a gate connected to an input terminal and one end grounded; a reverse conductive type impurity region formed in said second well, to which a substrate bias voltage is applied; a reverse conductive type input-protecting MOS transistor formed in said second well and having a gate and one end both grounded and the other end connected to the input terminal; and when a surge voltage is applied to the input terminal, circuits formed in the semiconductor substrate are protected by passing current by way of the input terminal, the other end of said input-protecting MOS transistor, said buried layer, said MOS transistor formed in said first well, and a ground terminal, in addition to current flowing between the one end and the other end of said input-protecting MOS transistor.

In the semiconductor integrated circuit device according to the present invention, a when a surge voltage is applied to the input terminal, since current path can be formed not only through the input-protecting MOS transistor but also by way of the input terminal, the other end of the input-protecting MOS transistor, the buried layer, the MOS transistor formed in the first well, and the 9round terminal, it is possible to improve the protective characteristics of the circuit device against the surge voltage.

DETAILED DESCRIPTION OF THE EMBODIMENTS

Figure 4:
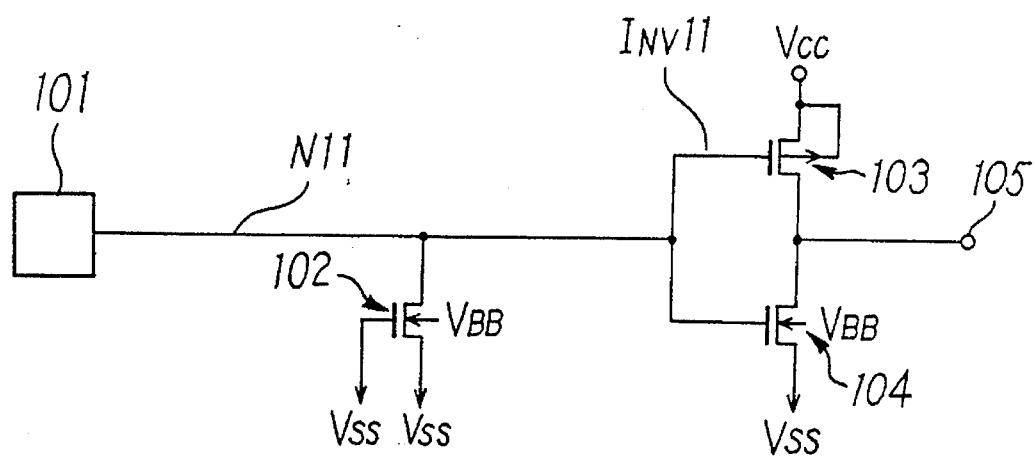
FIG. 4 is a circuit diagram showing the semiconductor integrated circuit device provided with the input-protecting circuit according to the present invention.
Figure 5:
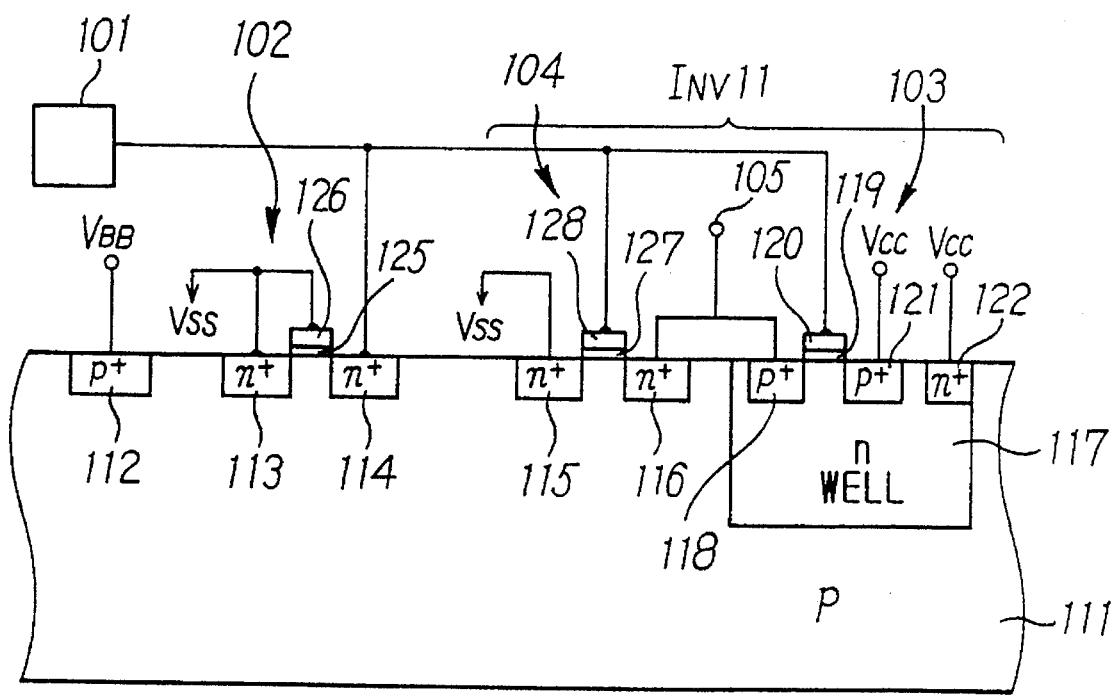
FIG. 5 is a longitudinal cross-sectional view showing an element structure of a semiconductor integrated circuit device provided with an input-protecting circuit related as background to the present invention.

An embodiment of the present invention will be described hereinbelow with reference to the attached drawings. The circuit diagram of the embodiment of the present invention is the same as that shown in FIG. 4. However, the structure of elements formed on a semiconductor substrate is different from that of the related background semiconductor integrated circuit as shown in FIG. 5.

Figure 3A:
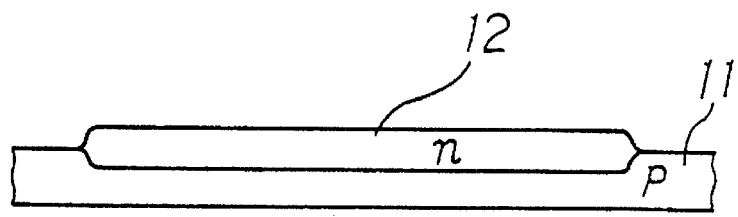
FIGS. 3(A) to (C) are cross-sectional views for assistance in explaining the procedure of forming the elements of the same semiconductor integrated circuit device shown in FIG. 1 on a semiconductor substrate.
Figure 3B:
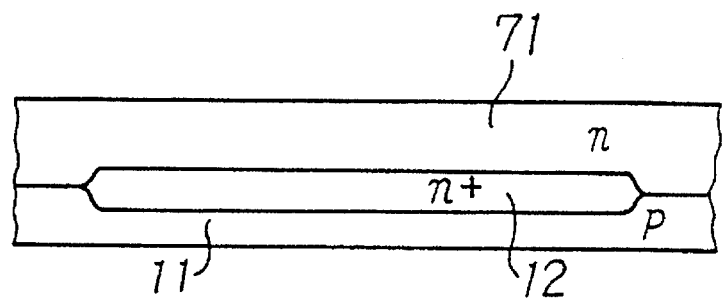
Figure 3C:
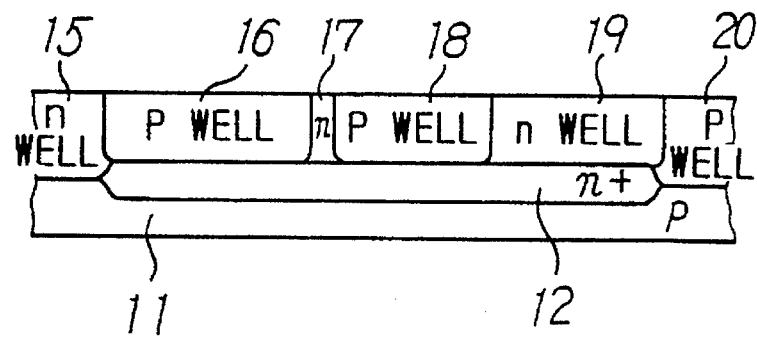

To manufacture the integrated circuit device according to the present invention, as shown in FIG. 3(a), an $n^+$-type buried layer 12 is formed on a surface of a p-type semiconductor substrate 11 in accordance with an impurity diffusion method. Further, as shown in FIG. 3(b), an $n^+$-type epitaxial layer 71 is formed on the formed $n^+$-type buried layer 12 in accordance with a vapor phase epitaxy technique. After that, as shown in FIG. 3(c), a p-type well 16, an n-type well 17, a p-type well 18 and an n-type well 19 are formed in the formed epitaxial layer 71 by implanting and diffusing p-type and n-type impurities, respectively.

Figure 1:
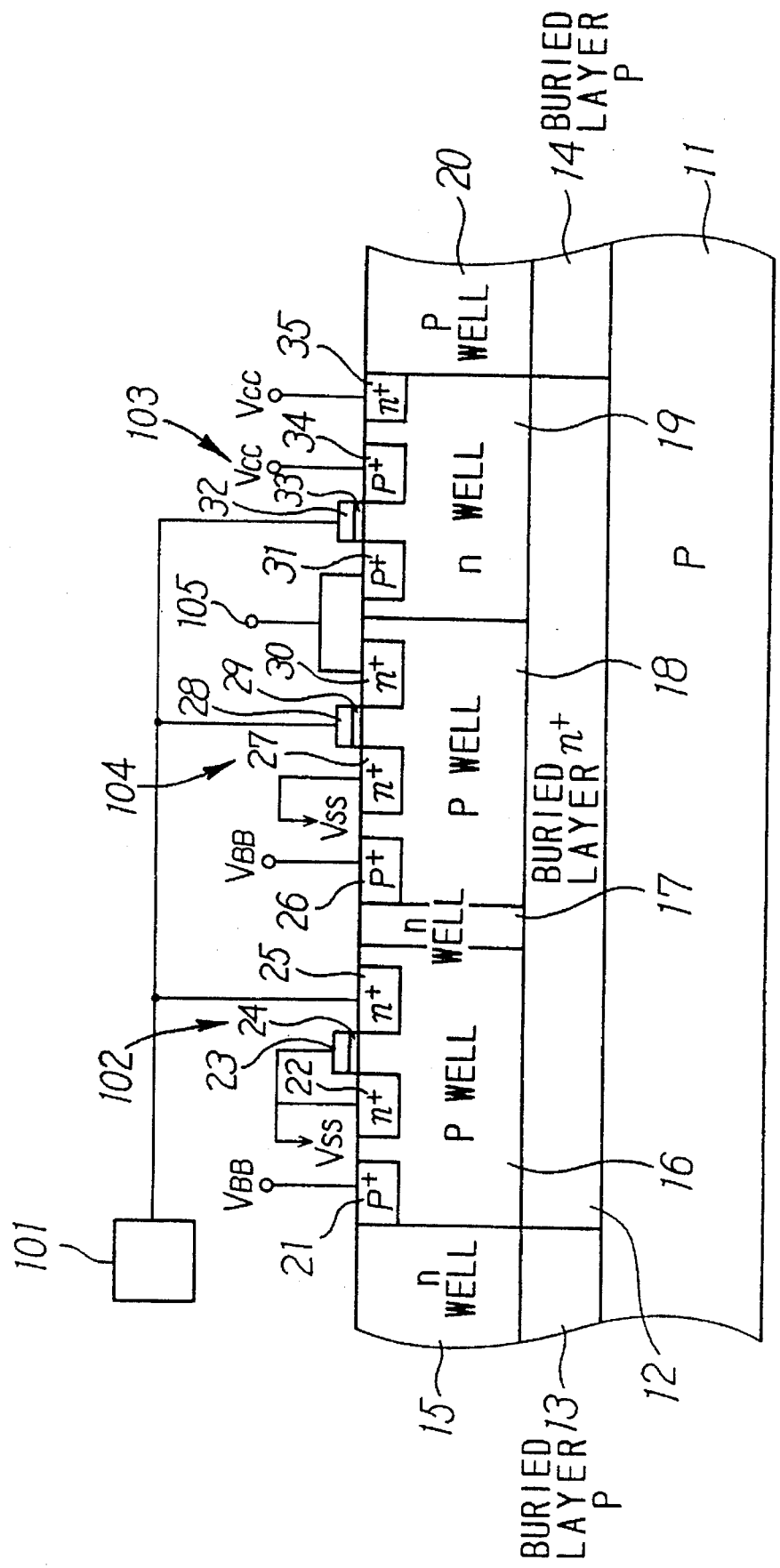
FIG. 1 is a longitudinal cross-sectional view showing an element structure of an embodiment of the semiconductor integrated circuit device provided with an input-protecting circuit according to the present invention.

Thereafter, the semiconductor integrated circuit device of the present invention is formed on the formed p-type and n-type wells, respectively. The integrated circuit device is composed of an input-protecting transistor 102 and an inverter INV11 (a first input stage of the internal circuit) composed of a p-type MOS transistor 103 and an n-type MOS transistor 104. The input-protecting transistor 102 is formed in the p-type well 16. The p-type MOS transistor 103 is formed in the in the n-type well 19. The n-type MOS transistor 104 is formed in the p-type well 18. FIG. 1 is a longitudinal cross-sectional view showing the element structure of these transistors 102, 103 and 104, respectively.

That is, in FIG. 1, in the epitaxial layer 71 formed as described above with reference to FIG. 3(b), the input-protecting transistor 102 is formed in the p-type well 16, and the inverter INV11 for the first input stage is formed in the p-type well 18 and the n-type well 19, respectively. Further, an n-type well 17 is formed between the two p-type wells 16 and 18; an n-type well 15 is formed in the vicinity of the p-type well 16; and a p-type well 20 is formed in the vicinity of the n-type well 19, respectively.

On the surface of the p-type well 16, in order to construct the input-protecting N channel transistor 102, a source region ($n^+$-type impurity region) 25, a drain region ($n^+$ impurity region) 22, a gate oxide film 24, and a gate electrode 23 are formed. Further, a $P^+$-type impurity region 21 is formed in the p type well 16 to apply a substrate bias voltage $V_{BB}$. The source region 25 is connected to an input terminal 101.

On the surface of the p-type well 18, in order to construct the N-channel transistor 104 of the first input stage inverter INV11, a source region ($n^+$-type impurity region) 27, a drain region ($n^+$-type impurity region) 30, a gate oxide film 29, and a gate electrode 28 are formed. Further, a $P^+$-type impurity region 26 is formed in the p-type well 18 to apply a substrate bias voltage $V_{BB}$. The gate electrode 28 is connected to the input terminal 101; the source region 27 is grounded; and the drain region 30 is connected to the output terminal 105.

On the surface of the n-type well 19, in order to construct the P-channel transistor 103 of the first input stage inverter INV11, a source region ($p^+$-type impurity region) 34, a drain region ($p^+$-type impurity region) 31, a gate oxide film 33, and a gate electrode 32 are formed. Further, an $n^+$-type impurity region 35 is formed in the n-type well 19 to apply a supply voltage $V_{CC}$. The gate electrode 32 is connected to the input terminal 101; the source region 34 is connected to the supply voltage terminal $V_{CC}$; and the drain region 31 is connected to the output terminal 105.

Figure 2:
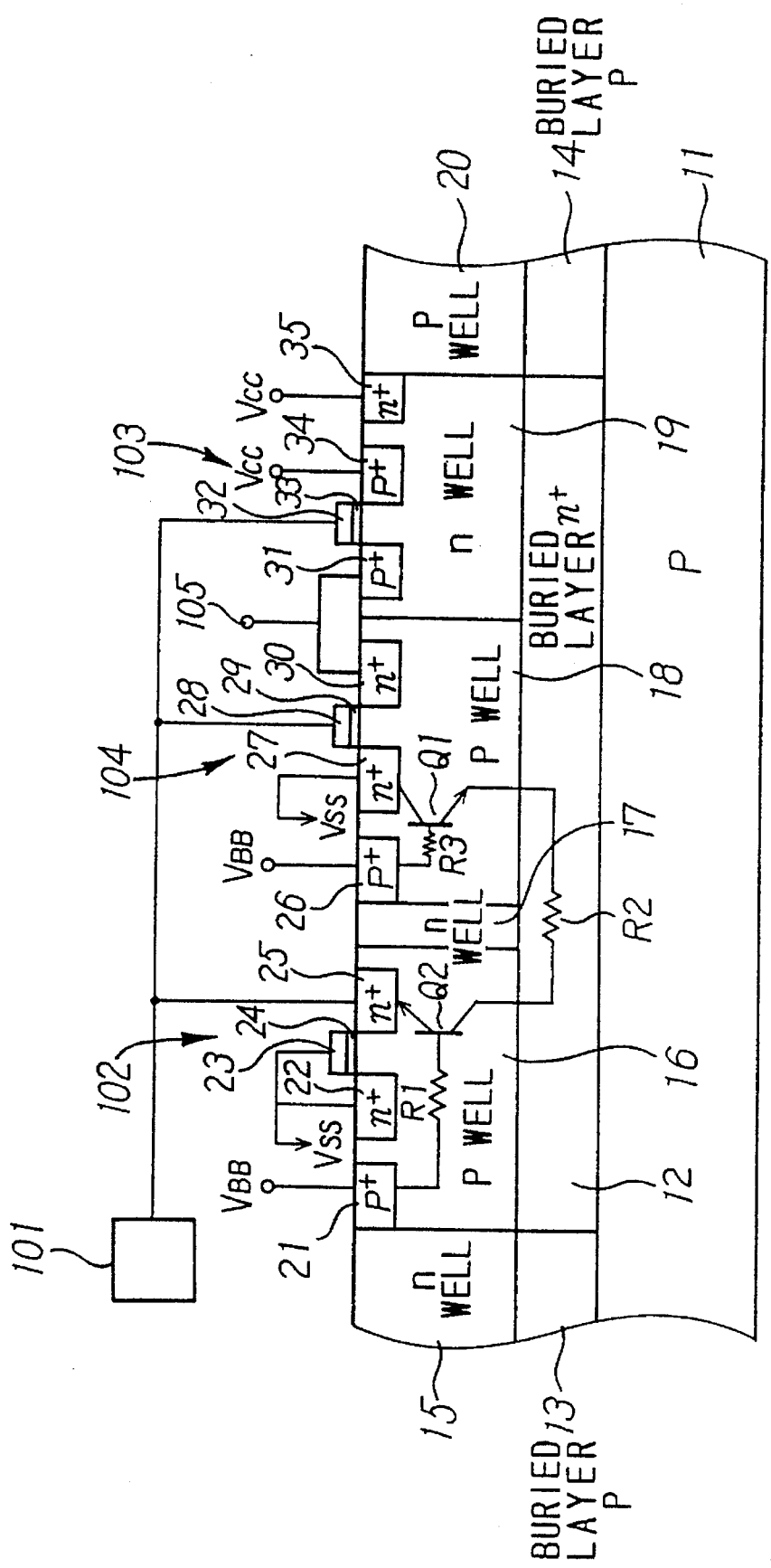
FIG. 2 is a longitudinal cross-sectional view showing the same element structure of the semiconductor integrated circuit device shown in FIG. 1, for assistance in explaining a current path newly formed when a negative surge voltage is applied to the input terminal.

FIG. 2 shows the connection relationship of two newly-formed transistors obtained whenever a negative surge voltage is applied to the input terminal 101, in the semiconductor integrated circuit device constructed as shown in FIG. 1.

In the case where a negative surge voltage is applied to the input terminal 101 and further this voltage exceeds the threshold voltage of the transistor 102, in the same way as with the case of the integrated circuit device as shown in FIG. 5, the transistor 102 is turned on, so that the surge current flows through the turned-on transistor 102 to prevent the surge voltage from being applied to the input stage inverter INV11. In this embodiment, in addition to the transistor 102, two bipolar transistor Q1 and Q2 are formed in the p-type wells and current flows therethrough.

In more detail, in the p-type well 18, there is formed an npn-type bipolar transistor Q1 having a collector at the source region ($n^+$-type impurity region) 27, a base at the $p^+$-type impurity region 26 and an emitter at the $n^+$-type buried layer 12. Here, the base resistance of the transistor Q1 is assumed to be R3.

On the other hand, there is formed an $npn^+$-type bipolar transistor Q2 having a collector at the $n^+$-type buried layer 12, a base at the p type well 16 and an emitter at the drain region ($n^+$-type impurity region) 25. Here, a resistance R2 exists between the emitter of the bipolar transistor Q1 and the collector of the bipolar transistor Q2. Further, the base resistance of the transistor Q2 is assumed to be R1.

As described above, since two transistors Q1 and Q2 are newly formed, a surge current flows from the ground terminal to the input terminal 101, by way of the source region 27 of the bipolar transistor Q1, the $n^+$-type buried layer 12, and the drain region 25 of the bipolar transistor Q2. As a result, since the surge current flows through both the bipolar transistors Q1 and Q2 in addition to the transistor 102, it is possible to improve the input-protection characteristics markedly in comparison with the circuit device as shown in FIG. 5.

The embodiment has been explained by way of example. Therefore, without being limited only thereto, the embodiment can be modified. For instance, the conductive types of the respective portions of the embodiment circuit can all be reversed.

What is claimed is:

1. A semiconductor integrated circuit device, comprising:

a semiconductor substrate having a first conductivity type;

a buried layer having a second conductivity type opposite to said first conductivity type formed on a surface of said semiconductor substrate;

a semiconductor layer having said second conductivity type formed on said buried layer;

a first well of said first conductivity type formed in said semiconductor layer;

a second well of said first conductivity type formed in said semiconductor layer and electrically isolated from said first well;

a second conductivity type-MOS transistor formed in said first well and having first and second impurity regions having said second conductivity type and a gate, said first impurity region grounded, the second impurity region connected to an input terminal to which an external signal is input, and the gate grounded and connected to said first impurity region; and an impurity region having said second conductivity type grounded and formed in said second well, wherein when a surge voltage is applied to the input terminal, a current path is formed by way of said input terminal, the second impurity region of said second conductivity type-MOS transistor formed in said first well, said buried layer, the grounded impurity region formed in said second well, and a ground terminal.

2. A semiconductor integrated circuit device, comprising:

a semiconductor substrate having a first conductivity type;

a buried layer having a second conductivity type opposite to said first conductivity type formed on a surface of said semiconductor substrate;

an epitaxial layer having said second conductivity type formed on said buried layer;

first and second wells each of said first conductivity type formed in said epitaxial layer spaced apart from each other and electrically isolated from each other;

an impurity region having said first conductivity type formed in said first well, to which a substrate bias voltage is applied;

a second conductivity type-MOS transistor formed in said first well and having first and second impurity regions having said second conductivity type and a gate, the gate connected to an input terminal and said first impurity region grounded;

an impurity region having said first conductivity type formed in said second well, to which a substrate bias voltage is applied; and an input-protecting second conductivity type-MOS transistor formed in said second well and having first and second impurity regions having said second conductivity type and a gate, the gate and said first impurity region both grounded and the second impurity region connected to the input terminal, wherein when a surge voltage is applied to the input terminal, circuits formed in the semiconductor substrate are protected by passing a first current by way of the input terminal, the second impurity region of said input-protecting second conductivity type-MOS transistor, said buried layer, said second conductivity type-MOS transistor formed in said first well, and a ground terminal, in addition to a second current flowing between the second impurity region and the first impurity region of said input-protecting second conductivity type-MOS transistor.

3. A semiconductor integrated circuit device, comprising:

a semiconductor substrate having a first conductivity type;

a buried layer having a second conductivity type opposite to said first conductivity type formed on a surface of said semiconductor substrate using an impurity diffusion method;

an epitaxial layer having said second conductivity type formed on said buried layer using a vapor phase epitaxy method;

first and second wells each of said first conductivity type formed in said epitaxial layer spaced apart from each other and electrically isolated from each other;

a third well of said second conductivity type formed in said epitaxial layer and adjacent to said first well;

an impurity region having said first conductivity type formed in said first well, to which a substrate bias voltage is applied;

a second conductivity type-MOS transistor formed in said first well and having first and second impurity regions having said second conductivity type and a gate, the gate connected to an input terminal and said first impurity region grounded;

an impurity region having said first conductivity type formed in said second well, to which a substrate bias voltage is applied;

an input-protecting second conductivity type-MOS transistor formed in said second well and having first and second impurity regions having said second conductivity type and a gate, the gate and said first impurity region both grounded and the second impurity region connected to the input terminal; and a first conductivity type-MOS transistor formed in said third well and having first and second impurity regions having said first conductivity type and a gate, the second impurity region of said first conductivity type-MOS transistor connected to the second impurity region of said second conductivity type-MOS transistor, the gate of said first conductivity type-MOS transistor connected to the input terminal and the first impurity region of said first conductivity type-MOS transistor connected to a supply voltage terminal, wherein when a surge voltage is applied to the input terminal, circuits formed in the semiconductor substrate are protected by passing a first current by way of the input terminal, the second impurity region of said input-protecting second conductivity type-MOS transistor, said buried layer, the grounded first impurity region of said second conductivity type-MOS transistor and a ground terminal, in addition to a second current flowing between the second impurity region and the first impurity region of said input-protecting second conductivity type-MOS transistor.

4. The semiconductor integrated circuit device of claim 1, wherein when said surge voltage is applied to the input terminal, said current path is formed by way of the input terminal, the second impurity region of said second conductivity type-MOS transistor formed in said first well acting as an emitter for a first parasitic bipolar transistor, said buried layer acting as a collector for said first parasitic bipolar transistor and as an emitter for a second parasitic bipolar transistor, said grounded impurity region formed in said second well acting as a collector for said second parasitic bipolar transistor, and said ground terminal.

5. The semiconductor integrated circuit device of claim 4, wherein said first well acts as a base for said first parasitic bipolar transistor and said second well acts as a base for said second parasitic bipolar transistor.

6. The semiconductor integrated circuit device of claim 5, wherein an impurity region having said first conductivity type to which a substrate bias voltage is applied is formed in said first well and acts as a base terminal for said first parasitic bipolar transistor and wherein an impurity region having said first conductivity type to which a substrate bias voltage is applied is formed in said second well and acts as a base terminal for said second parasitic bipolar transistor.

7. The semiconductor integrated circuit device of claim 2, wherein when said surge voltage is applied to the input terminal, said first current is passed by way of the input terminal, the second impurity region of said input-protecting second conductivity type-MOS transistor formed in said second well acting as an emitter for a first parasitic bipolar transistor, said buried layer acting as a collector for said first parasitic bipolar transistor and as an emitter for a second parasitic bipolar transistor, said grounded first impurity region of said second conductivity type-MOS transistor formed in said first well acting as a collector for said second parasitic bipolar transistor, and said ground terminal.

8. The semiconductor integrated circuit device of claim 7, wherein said first well acts as a base for said second parasitic bipolar transistor and said second well acts as a base for said first parasitic bipolar transistor.

9. The semiconductor integrated circuit device of claim 8, wherein said impurity region having said first conductivity type to which a substrate bias voltage is applied formed in said first well acts as a base terminal for said second parasitic bipolar transistor and wherein said impurity region having said first conductivity type to which a substrate bias voltage is applied formed in said second well acts as a base terminal for said first parasitic bipolar transistor.

10. The semiconductor integrated circuit device of claim 3, wherein when said surge voltage is applied to the input terminal, said first current is passed by way of the input terminal, the second impurity region of said input-protecting second conductivity type-MOS transistor formed in said second well acting as an emitter for a first parasitic bipolar transistor, said buried layer acting as a collector for said first parasitic bipolar transistor and as an emitter for a second parasitic bipolar transistor, said grounded first impurity region of said second conductivity type-MOS transistor formed in said first well acting as a collector for said second parasitic bipolar transistor, and said ground terminal.

11. The semiconductor integrated circuit device of claim 10, wherein said first well acts as a base for said second parasitic bipolar transistor and said second well acts as a base for said first parasitic bipolar transistor.

12. The semiconductor integrated circuit device of claim 11, wherein said impurity region having said first conductivity type to which a substrate bias voltage is applied formed in said first well acts as a base terminal for said second parasitic bipolar transistor and wherein said impurity region having said first conductivity type to which a substrate bias voltage is applied formed in said second well acts as a base terminal for said first parasitic bipolar transistor.

* * * * *